(12) United States Patent
Edelson et al.

(10) Patent No.: US 7,659,840 B2
(45) Date of Patent: Feb. 9, 2010

(54) SIGMA-DELTA CONVERSION CIRCUIT SUITABLE FOR PHOTOCURRENT MEASUREMENT APPLICATIONS

(75) Inventors: Lawrence H. Edelson, Fremont, CA (US); Michael P. Daly, Newtownmountkennedy (IE); Trey A. Roessig, Palo Alto, CA (US)

(73) Assignee: Analog Devices, Inc., Norwood, MA (US)

( * ) Notice: Subject to any disclaimer, the term of this patent is extended or adjusted under 35 U.S.C. 154(b) by 47 days.

(21) Appl. No.: 12/070,267

(22) Filed: Feb. 15, 2008

(65) Prior Publication Data

US 2009/0207061 A1 Aug. 20, 2009

(51) Int. Cl.
*H03M 1/10* (2006.01)
(52) U.S. Cl. .................. 341/120; 341/118; 341/119; 341/121; 341/143; 341/155
(58) Field of Classification Search ......... 341/118–122, 341/143, 155
See application file for complete search history.

(56) References Cited

U.S. PATENT DOCUMENTS

| | | | | |
|---|---|---|---|---|
| 5,101,206 A | * | 3/1992 | Riedel | 341/156 |
| 5,652,586 A | * | 7/1997 | Chuh et al. | 341/172 |
| 6,198,420 B1 | * | 3/2001 | Ryan et al. | 341/155 |
| 6,201,426 B1 | * | 3/2001 | Sumiyoshi et al. | 327/291 |
| 6,285,310 B1 | * | 9/2001 | Michaelis et al. | 341/166 |
| 6,292,117 B1 | * | 9/2001 | Smith | 341/115 |
| 6,392,582 B1 | * | 5/2002 | Nakamura | 341/155 |
| 6,962,436 B1 | * | 11/2005 | Holloway et al. | 374/170 |
| 6,977,601 B1 | * | 12/2005 | Fletcher et al. | 341/143 |
| 7,095,354 B2 | * | 8/2006 | Harrison et al. | 341/159 |
| 7,126,509 B2 | * | 10/2006 | Sit et al. | 341/119 |
| 7,151,474 B2 | * | 12/2006 | Ortmanns et al. | 341/143 |
| 7,164,379 B1 | * | 1/2007 | Rao | 341/161 |
| 7,230,561 B2 | * | 6/2007 | Lee | 341/172 |
| 7,326,903 B2 | * | 2/2008 | Ackland | 250/208.1 |

OTHER PUBLICATIONS

Burr Brown Application Bulletin, Designing Photodiode Amplifier Circuits With OPA128, Jan. 1994, pp. 1-3.
Analog Devices, Serial Digital Output Thermometers, TMP03/TMP04, Rev. A, 2002, pp. 1-16.
Analog Devices, ±0.5° C. Accurate PWM Temperature Sensor in 5-Lead SC-7, TMP05/TMP06, Rev. B, pp. 1-28.
Analog Devices, ± 1° C. Accurate, 12-Bit Digital Temperature Sensor, ADT75, Rev. 0, pp. 1-24.

* cited by examiner

*Primary Examiner*—Linh V Nguyen
(74) *Attorney, Agent, or Firm*—Koppel, Patrick, Heybl & Dawson

(57) ABSTRACT

A sigma-delta converter suitable for measuring a photocurrent comprises an input node adapted to receive a current to be measured ($I_{meas}$), a capacitor connected to the input node, a clocked comparator coupled to the input node and to a reference voltage $V_{ref}$ at respective inputs, and a switchable current source connected to the input node which conducts a reference current $I_{ref}$ when switched on. The converter is arranged in a sigma-delta configuration, with the current source switched on to pull down the voltage ($V_{CMP}$) at the input node when the comparator output toggles due to $V_{CMP}$ increasing above $V_{ref}$ and to be switched off when the comparator output toggles due to $V_{CMP}$ falling below $V_{ref}$ such that the comparator output comprises a digital bitstream which varies with $I_{meas}$.

5 Claims, 2 Drawing Sheets

SIGMA-DELTA CONVERSION CIRCUIT SUITABLE FOR PHOTOCURRENT MEASUREMENT APPLICATIONS

BACKGROUND OF THE INVENTION

1. Field of the Invention

This invention relates generally to current measurement circuits, and more particularly, to measurement circuits suitable for producing a digital bitstream that varies with a measured photocurrent.

2. Description of the Related Art

Many circuits have been developed to detect ambient light level. Most use a photodiode or phototransistor device, which generates a photocurrent in response to light impinging on the device. A resistor or transimpedance amplifier convert the current to a suitably-ranged voltage.

The light being measured is typically generated with an AC voltage, such that the photocurrent includes components that vary with a multiple of the power line frequency, such as 50, 60 Hz, 100 or 120 Hz. Rejection of these frequencies typically requires the use of a large capacitor, which may be unacceptably costly or impractically large to produce on an IC die.

To provide a digital bit stream, the voltage resulting from the photocurrent is then generally processed with an analog-to-digital converter (ADC) or a comparator. However, this can be problematic when the circuit must distinguish between several different light levels. If an ADC is used, it would typically require a resolution sufficient to provide the sensitivity needed for setting and adjusting light level transition ranges. Similarly, a comparator would typically need high resolution programmable voltage reference levels to provide the necessary transition thresholds.

SUMMARY OF THE INVENTION

A sigma-delta converter suitable for measuring a photocurrent is presented which overcomes the problems noted above, providing a simple conversion method with a current measuring capability having a large dynamic range.

The present converter comprises an input node adapted to receive a current to be measured ($I_{meas}$), a capacitor connected to the input node such that the capacitor is charged by a $I_{meas}$, a clocked comparator coupled to the input node and to a reference voltage $V_{ref}$ at respective inputs and which toggles its output in response to a suitable clock signal, and a switchable current source connected to the input node which conducts a reference current $I_{ref}$ when switched on. The converter is arranged in a sigma-delta configuration, with the current source arranged to be switched on and pull down the voltage ($V_{CMP}$) at the input node when the comparator output toggles due to $V_{CMP}$ increasing above $V_{ref}$, and to be switched off when the comparator output toggles due to $V_{CMP}$ falling below $V_{ref}$. The resulting comparator output comprises a digital bitstream which varies with $I_{meas}$, with the bitstream time intervals established by the clock signal. Rejection of the power line frequency is preferably effected by averaging the value of $I_{meas}$ over an integral number of power line cycles.

These and other features, aspects, and advantages of the present invention will become better understood with reference to the following drawings, description, and claims.

DETAILED DESCRIPTION OF THE INVENTION

Figure 1:
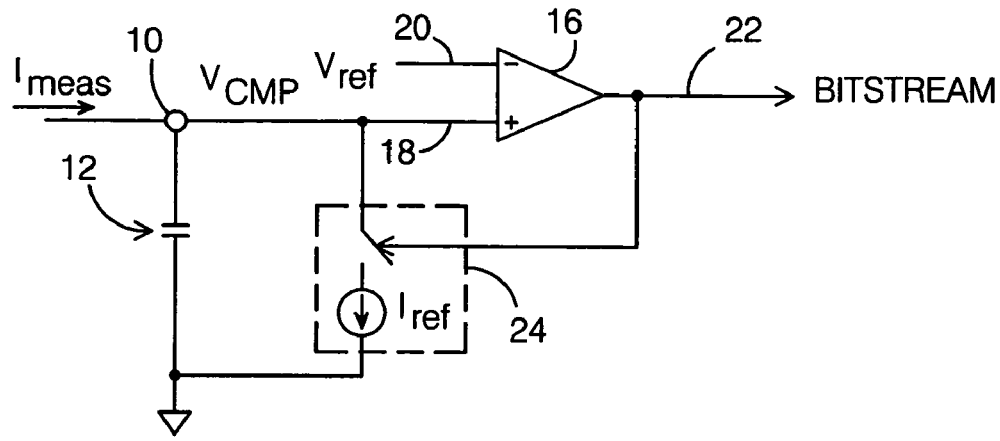
FIG. 1 is a schematic diagram illustrating the principles of a sigma-delta converter per the present invention.

The principles of a sigma-delta converter per the present invention are illustrated in FIG. 1. An input node 10 is adapted to receive a current to be measured $I_{meas}$, such as a photocurrent. A capacitor 12 is connected to input node 10 such that the capacitor is charged by $I_{meas}$; the resulting voltage at input node 10 is designated as $V_{CMP}$.

A comparator 16 is coupled to input node 10 at one input (18) and to a reference voltage $V_{ref}$ at a second input (20), and is arranged to toggle its output (22) when the voltage at input node 10 increases above or falls below $V_{ref}$. The comparator is preferably a clocked comparator, such that its output toggles synchronously with a periodic clock signal 23 (CLK), which restricts the comparator sampling to regular time intervals. A clocked comparator provides fast response and low hysteresis, and is preferred. Without a clock, the comparator feedback will tend to act as an unstable, high-gain amplifier and may produce irregular oscillations around $V_{ref}$.

A switchable current source 24 which conducts a reference current $I_{ref}$ when switched on is connected to input node 10, and arranged to be switched on and pull down $V_{CMP}$ when comparator output 22 toggles due to $V_{CMP}$ increasing above $V_{ref}$, and to be switched off when comparator output 22 toggles due to $V_{CMP}$ falling below $V_{ref}$. When so arranged, comparator output 22 toggles up and down to produce a digital bitstream which varies with $I_{meas}$, with the bitstream time intervals determined by the clock signal.

Figure 2:
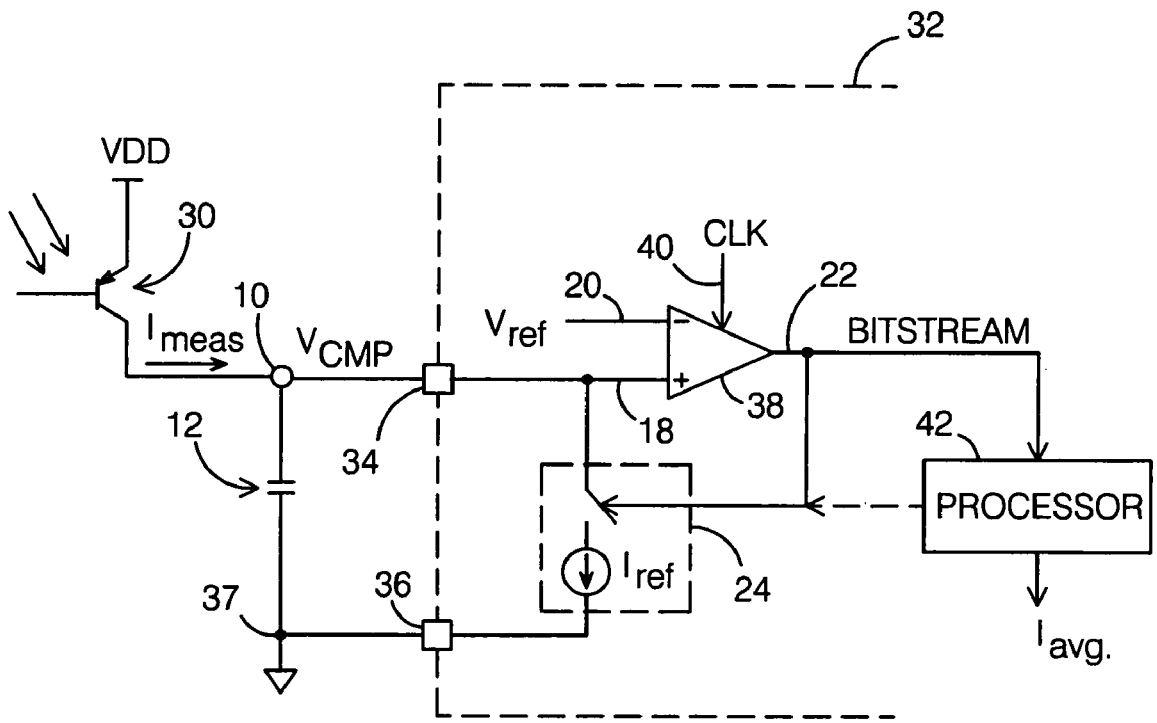
FIG. 2 is a schematic diagram of a sigma-delta converter per the present invention as it might be used to measure a photocurrent.

The present converter is well-suited for use in measuring a photocurrent generated by a photodiode or phototransistor in response to ambient light; an exemplary arrangement is shown in FIG. 2. Here, a phototransistor 30 generates current $I_{meas}$ in response to ambient light. The converter is preferably fabricated as an integrated circuit 32, having terminals 34, 36 connected to input node 10 and a circuit common point 37 respectively; capacitor 12 may be fabricated on-chip, or be connected externally as shown in FIG. 2.

In operation, current to be measured $I_{meas}$ is applied to capacitor 12, causing $V_{CMP}$ to increase. During the time that $V_{CMP} < V_{ref}$, the bitstream output 22 of comparator 16 will be zeros. When $V_{CMP}$ increases above $V_{ref}$, the bitstream output 22 of comparator 16 will become ones, which switches on current source 24 and eventually pulls $V_{CMP}$ below $V_{ref}$. When so arranged, the measured current $I_{meas}$ is given by:

$$I_{meas} = [x_{1s}/(x_{1s}+x_{0s})] * I_{ref}$$

where $x_{1s}$ is the number of ones and $x_{0s}$ is the number of zeros in the bitstream. Bitstream output 22 would typically be processed in a digital processor 42, which performs the required ratio calculation, as well as averaging, threshold detection, noise rejection, etc., as needed. A converter arranged as described above requires only a capacitor, a clocked comparator and a reference current, and provides robust performance which is relatively insensitive to capacitor value or clocking frequency.

Figure 3:
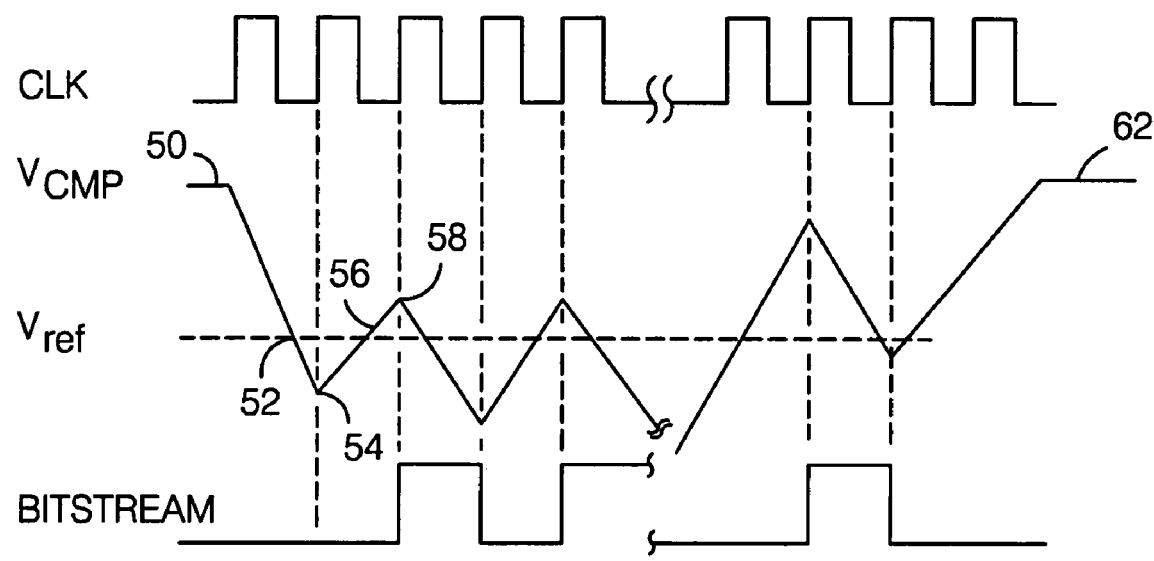
FIG. 3 is a timing diagram illustrating the operation of the converter of FIG. 2.

A timing diagram illustrating the operation of a converter in accordance with the present invention is shown in FIG. 3, which depicts clock signal 40, $V_{CMP}$, and the resulting bitstream for a varying $I_{meas}$ value (not shown). The converter is preferably arranged such that, when idle, $I_{ref}$ is switched off, such that $V_{CMP}$ rises up to near the source voltage of the phototransistor (VDD) as its collector voltage saturates (50). In this state, the converter draws no current. The converter and processor 42 are arranged to initialize the system by switching on $I_{ref}$ to make $V_{CMP} \approx V_{ref}$ (52). Then, a "conversion interval" 53 is started which comprises a plurality of sequentially-occurring conversion cycles, with each conversion cycle comprising:

1. Switching off $I_{ref}$ to begin the conversion cycle (54);

2. Allowing $V_{CMP}$ to increase due to $I_{meas}$ until it exceeds $V_{ref}$ (56). In this example, with $V_{CMP} > V_{ref}$, the comparator output will toggle from a 'zero' to a 'one' on the occurrence of the next rising clock edge. Note that a converter might alternatively be arranged such that the comparator output toggles on a falling edge, or on either clock edge.

3. A 'one' on the comparator output causes current source 24 to be switched on, such that $I_{ref}$ pulls $V_{CMP}$ below $V_{ref}$ (58). Depending on the ratio between $I_{meas}$ and $I_{ref}$, it may take several clock cycles for $V_{CMP}$ to fall below $V_{ref}$.

The converter and processor are preferably arranged such that conversion interval 53 has a predetermined duration, with $I_{meas}$ calculated after a conversion interval has ended. At the end of the conversion interval, $I_{ref}$ may be switched off such that $V_{CMP}$ again rises to near VDD (62).

In general, the rising and falling edges of the sawtooth shown in FIG. 3 will not have the same slope. For example, if $I_{meas}$ is low, the slope of the rising edges will be shallow compared to that of the falling edges, since the discharging of capacitor 12 by $I_{ref}$ will be relatively fast compared to the speed with which capacitor 12 is charged by $I_{meas}$. On the other hand, when $I_{meas} \approx I_{ref}$, the falling edges will be shallow and the rising edges steep. A symmetric sawtooth will occur when $I_{meas}$ is one-half $I_{ref}$.

As shown in FIG. 3, $V_{CMP}$ ripples above and below $V_{ref}$ during a conversion interval. $V_{CMP}$ during this time will be synchronized to CLK. Assuming a 100 kHz comparator clock, $V_{CMP}$ will have a "pink" noise spectrum—i.e., low at low frequencies, and increasing up to 50 kHz. If the converter is arranged such that the peak-to-peak value of $V_{CMP}$ is sufficiently large, this noise source will be inconsequential. Increasing the size of the capacitor will decrease the peak-to-peak amplitude, though after an order of magnitude, the conversion may begin to suffer as a result of small amounts of hysteresis in the comparator affecting the resolution. Allowing the peak-to-peak amplitude to become too small also makes it easier for the bitstream to become corrupted by external noise sources. Conversely, too large of a peak-to-peak amplitude may cause variations in $I_{meas}$ that are not due to changes in the light level; an extreme example is a ripple voltage that would cause the phototransistor to saturate.

When $I_{meas}$ is a photocurrent, it is typically generated by light that varies periodically with one or more possible power line frequencies. The duration of conversion interval 53 is preferably selected such that the converter determines the average value of $I_{meas}$ over an integral number of power line cycles. Averaging $I_{meas}$ over, for example, 5 or 6 power line cycles enables the converter to attenuate the power line frequency or even reject it completely. The degree of attenuation is dependent on the frequency accuracy of the clock signal and the local power grid, but should be at least 20 dB.

For example, assume a 100 kHz comparator clock, with processor 42 arranged to average $I_{meas}$ over 8192 ($2^{13}$) conversion cycles. This results in a conversion interval duration of about 82 ms, effectively averaging out 50, 60, 100 and 120 Hz ripples, and a potential resolution of 14 bits for the ones count during each conversion interval. This provides a sufficient degree of over-sampling to provide stable 8-bit digitization of $I_{meas}$.

Noise sources that might otherwise corrupt the bitstream tend to be removed from the measurement, as long as the noise sources are not synchronous with the clock signal and the conversion interval is long relative to the typical noise period.

One possible variation for when the converter is idle is to isolate VDD and allow $V_{CMP}$ to stabilize at some intermediate level, rather than allowing $V_{CMP}$ to rise up to VDD as described above. Allowing $V_{CMP}$ to rise to VDD is not ideal, as this can result in errors on the first conversion, but the digital circuitry attempts to ignore the data until $V_{CMP}$ crosses $V_{ref}$. In addition, depending on the ambient light level, allowing $V_{CMP}$ to rise to VDD may result in the first conversion being delayed. A possible improvement would be to force the voltage at the emitter of phototransistor 30 to $V_{ref}$ at idle, but the benefits this might provide are offset by the added complexity that would be required.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A sigma-delta converter suitable for measuring a photocurrent, comprising:

an input node adapted to receive a current to be measured $I_{meas}$;

a capacitor connected to said input node such that said capacitor is charged by $I_{meas}$;

a periodic clock signal;

a clocked comparator which receives said clock signal and is coupled to said input node at one input and to a reference voltage $V_{ref}$ at a second input, said comparator arranged to toggle its output synchronously with said clock signal when the voltage at said input node increases above or falls below said reference voltage;

a switchable current source which conducts a reference current $I_{ref}$ when switched on and is connected to said input node, said current source arranged to be switched on and pull down the voltage ($V_{CMP}$) at said input node when said comparator output toggles due to $V_{CMP}$ increasing above said reference voltage, and to be switched off when said comparator output toggles due to $V_{CMP}$ falling below said reference voltage, such that the output of said comparator comprises a digital bitstream which varies with $I_{meas}$; and a digital processor which receives said digital bitstream, said converter and processor arranged to:

initialize $V_{CMP}$ by switching on $I_{ref}$ to make $V_{CMP} \approx V_{ref}$; and begin a conversion interval that comprises a plurality of sequentially-occurring conversion cycles, each of said cycles comprising:

switching off $I_{ref}$ to begin said conversion cycle;

allowing $V_{CMP}$ to increase due to $I_{meas}$ until it exceeds $V_{ref}$; and switching on $I_{ref}$ to pull $V_{CMP}$ below $V_{ref}$;

such that $I_{meas}$ is given by:

$$I_{meas} = [x_{1s}/(x_{1s}+x_{0s})] * I_{ref},$$

where $x_{0s}$ is the number of 'zeroes' that occur in said bitstream while $V_{CMP}$ is increasing but is less than $V_{ref}$, and $x_{1s}$ is the number of 'ones' that occur in said bitstream while $V_{CMP}$ is decreasing but is greater than $V_{ref}$.

2. The converter of claim 1, wherein said digital processor is arranged such that said conversion interval has a predetermined duration and $I_{meas}$ is calculated after a conversion interval has ended.

3. The converter of claim 2, wherein said current $I_{meas}$ is a photocurrent generated by light that varies periodically with one or more possible power line frequencies, said predetermined duration selected such that said converter determines the average value of $I_{meas}$ over an integral number of power line cycles.

4. A sigma-delta converter for measuring a photocurrent, comprising:
- an input node adapted to receive a photocurrent to be measured $I_{meas}$;
- a capacitor connected between said input node and a circuit common point such that said capacitor is charged by a $I_{meas}$;
- a periodic clock signal;
- a clocked comparator coupled to said input node at one input and to a reference voltage $V_{ref}$ at a second input and arranged to toggle its output synchronously with said clock signal when the voltage at said input node increases above or falls below said reference voltage;
- a switchable current source which conducts a reference current $I_{ref}$ when switched on and is connected to said input node, said current source arranged to be switched on and pull down the voltage ($V_{CMP}$) at said input node when said comparator output toggles due to $V_{CMP}$ increasing above said reference voltage, and to be switched off when said comparator output toggles due to $V_{CMP}$ falling below said reference voltage, such that the output of said comparator comprises a digital bitstream which varies with $I_{meas}$; and
- a digital processor which receives said digital bitstream, said converter and processor arranged to:
  - initialize $V_{CMP}$ by switching on $I_{ref}$ to make $V_{CMP} \approx V_{ref}$; and
  - begin a conversion interval that comprises a plurality of sequentially-occurring conversion cycles, each of said cycles comprising:
    - allowing $V_{CMP}$ to increase due to $I_{meas}$ until it exceeds $V_{ref}$; and
    - switching on $I_{ref}$ to pull $V_{CMP}$ below $V_{ref}$;
  - said digital processor arranged such that said conversion interval has a predetermined duration and $I_{meas}$ is calculated after a conversion interval has ended, $I_{meas}$ given by:

$$I_{meas} = [x_{1s}/(x_{1s}+x_{0s})] * I_{ref},$$

where $x_{0s}$ is the number of 'zeroes' that occur in said bitstream during said conversion interval while $V_{CMP}$ is increasing but is less than $V_{ref}$, and $x_{1s}$ is the number of 'ones' that occur in said bitstream during said conversion interval while $V_{CMP}$ is decreasing but is greater than $V_{ref}$.

5. The converter of claim 4, wherein said photocurrent is generated by light that varies periodically with one or more possible power line frequencies, said predetermined duration selected such that said converter determines the average value of $I_{meas}$ over an integral number of power line cycles.

* * * * *